United States Patent
Jheng et al.

(10) Patent No.: US 11,290,020 B2
(45) Date of Patent: Mar. 29, 2022

(54) VOLTAGE MODE CONTROLLER APPLIED TO SHORT-CIRCUITED PROTECTION OF A POWER CONVERTER AND OPERATIONAL METHOD THEREOF

(71) Applicant: Leadtrend Technology Corp., Hsinchu County (TW)

(72) Inventors: Ruei-Jhih Jheng, Hsinchu County (TW); Wei-Cheng Su, Hsinchu County (TW)

(73) Assignee: Leadtrend Technology Corp., Hsinchu County (TW)

( * ) Notice: Subject to any disclaimer, the term of this patent is extended or adjusted under 35 U.S.C. 154(b) by 2 days.

(21) Appl. No.: 17/006,877

(22) Filed: Aug. 30, 2020

(65) Prior Publication Data

US 2021/0351710 A1    Nov. 11, 2021

(30) Foreign Application Priority Data

May 8, 2020    (TW) .................................. 109115320

(51) Int. Cl.
*H02M 1/36* (2007.01)
*H02M 3/335* (2006.01)
(Continued)

(52) U.S. Cl.
CPC ........ *H02M 3/33576* (2013.01); *G01R 1/203* (2013.01); *G01R 19/16538* (2013.01);
(Continued)

(58) Field of Classification Search
CPC ...... H02M 1/36; H02M 3/33576; H02M 1/08; H02M 1/0025; H02H 7/1213; H02H 3/08;
(Continued)

(56) References Cited

U.S. PATENT DOCUMENTS

| | | | | |
|---|---|---|---|---|
| 2007/0247879 A1* | 10/2007 | Yang | ........................ | H02M 1/36 363/49 |
| 2013/0314064 A1* | 11/2013 | Theiler | ................... | H05B 47/28 323/282 |

(Continued)

FOREIGN PATENT DOCUMENTS

GB    2530316 A  *  3/2016  .............. H02M 1/32

*Primary Examiner* — Harry R Behm
(74) *Attorney, Agent, or Firm* — Winston Hsu (57) ABSTRACT

A voltage mode controller applied to short-circuited protection of a power converter includes gate control signal generation circuit and control circuit. The control circuit generates control signal to make the gate control signal generation circuit generate predetermined signal to power switch of the primary side of the power converter before the power converter starts up and when supply voltage is greater than first reference voltage, enables short-circuited protection after predetermined enabling period of the predetermined signal if detection voltage is less than second reference voltage during the predetermined enabling period. The short-circuited protection makes the power converter not start up, and after the power converter starts up, the short-circuited protection is enabled to turn off the power converter if the detection voltage is less than the second reference voltage for de-bounce time and compensation voltage is greater than third reference voltage.

22 Claims, 8 Drawing Sheets

(51) Int. Cl.
  *G01R 19/165* (2006.01)
  *G01R 1/20* (2006.01)
  *H02H 7/12* (2006.01)
  *H02H 3/08* (2006.01)
  *H02M 1/08* (2006.01)
  *H02M 1/00* (2006.01)
(52) U.S. Cl.
  CPC ............ *H02H 3/08* (2013.01); *H02H 7/1213* (2013.01); *H02M 1/08* (2013.01); *H02M 1/36* (2013.01); *H02M 1/0025* (2021.05)
(58) Field of Classification Search
  CPC . H02H 1/0025; G01R 19/16538; G01R 1/203
  See application file for complete search history.

(56) References Cited

U.S. PATENT DOCUMENTS

| | | | |
|---|---|---|---|
| 2014/0160802 A1* | 6/2014 | Zhang | H02M 1/32 363/21.01 |
| 2015/0061630 A1* | 3/2015 | Xu | H02M 1/32 323/283 |
| 2015/0200536 A1* | 7/2015 | Li | H02H 7/1213 361/18 |

* cited by examiner

VOLTAGE MODE CONTROLLER APPLIED TO SHORT-CIRCUITED PROTECTION OF A POWER CONVERTER AND OPERATIONAL METHOD THEREOF

BACKGROUND OF THE INVENTION

1. Field of the Invention

The present invention relates to a voltage mode controller applied to short-circuited protection of a power converter and an operational method thereof, and particularly to the voltage mode controller and the operational method thereof that can determine whether to enable the short-circuited protection before and after the power converter starts up.

2. Description of the Prior Art

In the prior art, a short-circuited protection related to current sense of a flyback power converter is enabled when a detection voltage is continuously less than a reference voltage fora de-bounce time, wherein the detection voltage is determined by a detection resistor and a primary side current flowing through a primary side of the flyback power converter, the short-circuited protection is enabled by a voltage mode controller applied to the primary side of the flyback power converter, and the short-circuited protection corresponds to the detection resistor that is short-circuited.

However, when a load coupled to a secondary side of the flyback power converter is light (or when the load is a light-emitting diode and under a low dimming requirement), because output power required by the load is smaller, the primary side current is smaller, resulting in the detection voltage being smaller. Meanwhile, the detection voltage may be continuously less than the reference voltage for a period of time, so the short-circuited protection may be falsely triggered.

In addition, because an input direct current (DC) voltage of the primary side of the flyback power converter is smaller at an area near a valley between two consecutive half-periods of the input DC voltage, the detection voltage corresponding to the area near the valley is also smaller. Meanwhile, the short-circuited protection may also be falsely triggered.

In addition, when a Limited Power Source (LPS) test is executed, the limited power source test simultaneously makes the detection resistor short-circuited and increases the load. Although the voltage mode controller will not receive the detection voltage (because the detection resistor is short-circuited), since the voltage mode controller is controlled by a voltage mode, the voltage mode controller can still operate normally. That is, because the voltage mode controller does not receive the detection voltage, the voltage mode controller can still increase a turning-on time of a power switch of the primary side of the flyback power converter in response to the voltage mode controller not receiving the detection voltage, resulting in the compensation voltage of the voltage mode controller being increased. Meanwhile, if the short-circuited protection of the flyback power converter is not triggered, the flyback power converter may eventually be burned down.

Therefore, how to design the voltage mode controller with better short-circuited protection becomes an important issue for a designer of the voltage mode controller

SUMMARY OF THE INVENTION

An embodiment of the present invention provides a voltage mode controller applied to a short-circuited protection of a power converter, wherein the voltage mode controller is installed in a primary side of the power converter. The voltage mode controller includes a gate control signal generation circuit and a control circuit. The control circuit coupled to the gate control signal generation circuit for generating a control signal to make the gate control signal generation circuit generate a predetermined signal to a power switch of the primary side of the power converter before the power converter starts up and when a supply voltage is greater than a first reference voltage, and enabling the short-circuited protection after a predetermined enabling period of the predetermined signal if a detection voltage is less than a second reference voltage during the predetermined enabling period. The short-circuited protection makes the power converter not start up, and after the power converter starts up, and the short-circuited protection is enabled to turn off the power converter if the detection voltage is less than the second reference voltage for a de-bounce time and a compensation voltage is greater than a third reference voltage.

Another embodiment of the present invention provides an operational method of a voltage mode controller applied to a short-circuited protection of a power converter. The voltage mode controller includes a gate control signal generation circuit and a control circuit, wherein the voltage mode controller is installed in a primary side of the power converter. The operational method includes: before the power converter starts up and when a supply voltage is greater than a first reference voltage, the control circuit generating a control signal to make the gate control signal generation circuit generate a predetermined signal to a power switch of the primary side of the power converter; if a detection voltage is less than a second reference voltage during a predetermined enabling period of the predetermined signal, the control circuit enabling the short-circuited protection after the predetermined enabling period, wherein the short-circuited protection makes the power converter not start up; and after the power converter starts up, if a compensation voltage is greater than a third reference voltage and the detection voltage is less than the second reference voltage for a de-bounce time, the control circuit enabling the short-circuited protection to turn off the power converter.

The present invention provides a voltage mode controller applied to a primary side of a power converter. The voltage mode controller makes a gate control signal generation circuit generate a predetermined signal to a power switch of the primary side of the power converter before the power converter starts up, and determines whether to enable a short-circuited protection according to a detection voltage corresponding to the predetermined signal. In addition, the voltage mode controller determines whether to enable the short-circuited protection according to a compensation voltage, the detection voltage, and a de-bounce time after the power converter starts up. Therefore, compared to the prior art, because the present invention determines whether to enable the short-circuited protection according to the compensation voltage, the detection voltage, and the de-bounce time after the power converter starts up, the present invention not only can solve a problem of the short-circuited protection being falsely triggered in the prior art but can also pass conditions of a limited power source (LPS) test. In addition, compared to the prior art, the present invention can also determine whether to enable the short-circuited protection according to the detection voltage corresponding to the predetermined signal before the power converter starts up.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
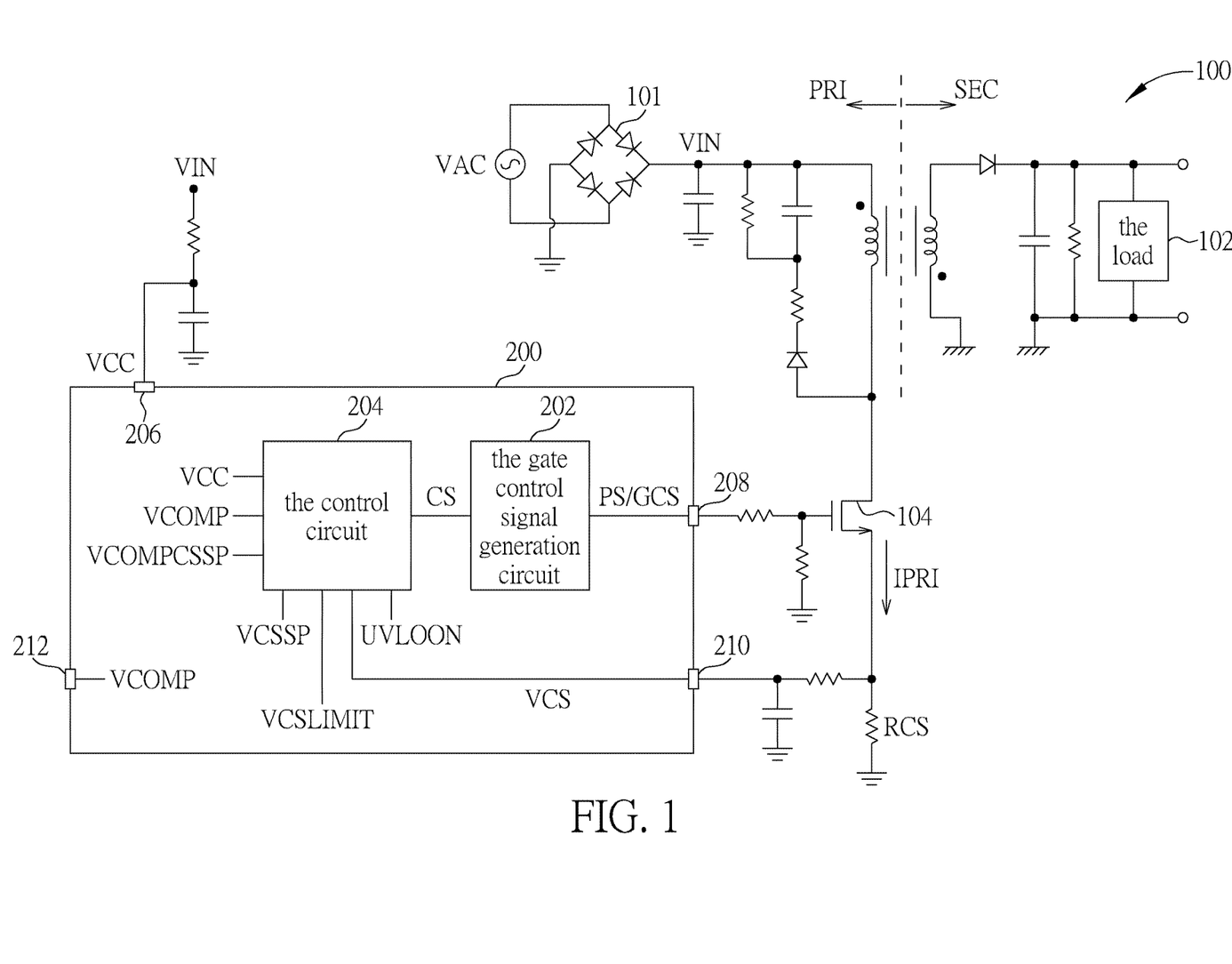
FIG. 1 is a diagram illustrating a voltage mode controller applied to a primary side of a power converter according to a first embodiment of the present invention.

Please refer to FIG. 1, FIG. 1 is a diagram illustrating a voltage mode controller 200 applied to the short-circuited protection of a power converter 100 according to a first embodiment of the present invention, wherein the power converter 100 is a power factor correction (PFC) power converter, the voltage mode controller 200 is a single-stage controller which is installed in a primary side PRI of the power converter 100, the voltage mode controller 200 includes a gate control signal generation circuit 202 and a control circuit 204, the control circuit 204 is coupled to the gate control signal generation circuit 202, and the power converter 100 is a flyback power converter. In addition, in one embodiment of the present invention, the power converter 100 can be applied to lighting applications. For example, a load 102 coupled to a secondary side SEC of the power converter 100 may be a light-emitting diode.

Figure 2:
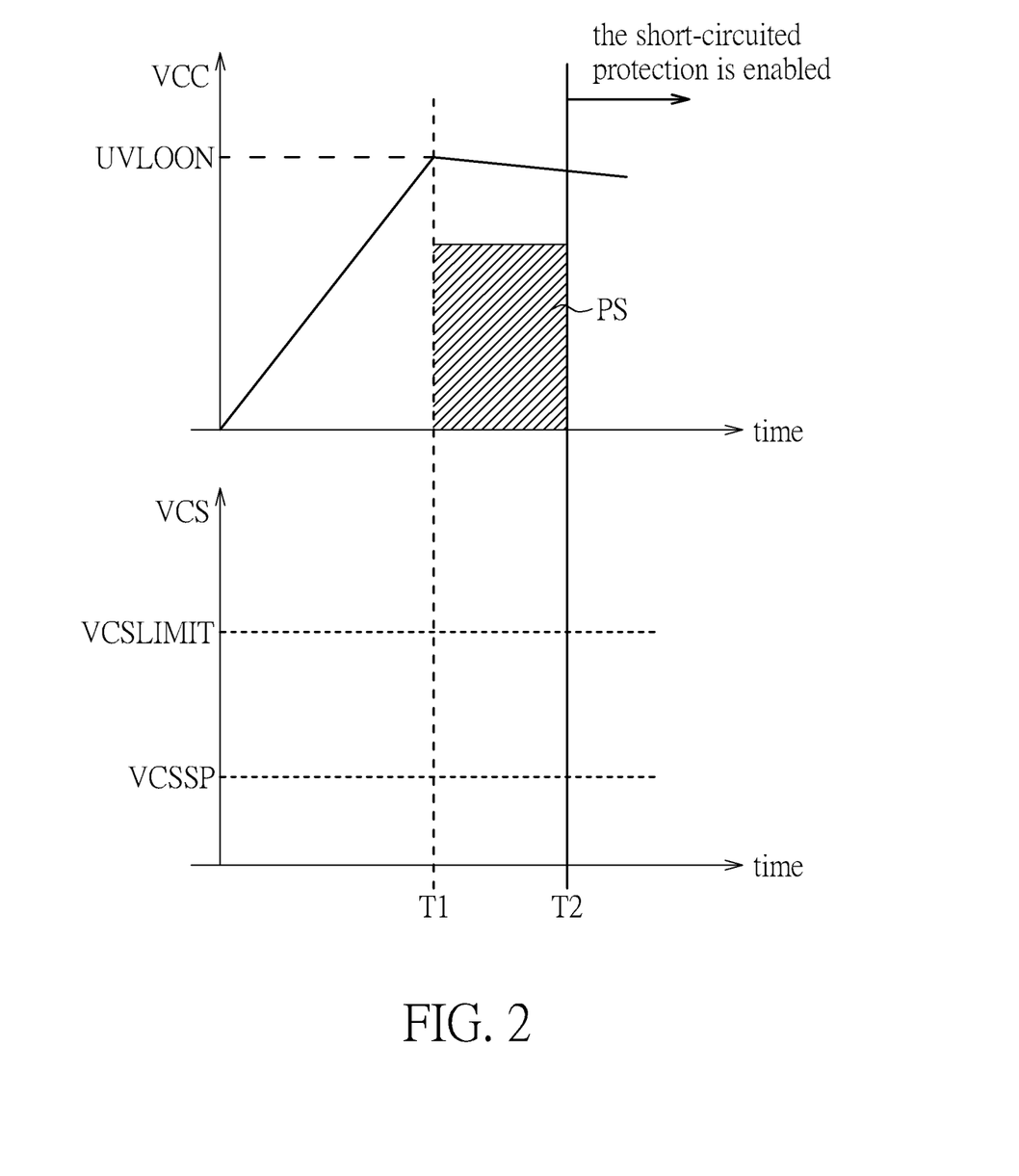
FIGS. 2-4 are diagrams illustrating operational principles of the short-circuited protection before the power converter starts up.

Please refer to FIGS. 1, 2, the control circuit 204 generates a control signal CS to make the gate control signal generation circuit 202 generate a predetermined signal PS to a power switch 104 of the primary side PRI of the power converter 100 before the power converter 100 starts up and when a supply voltage VCC is greater than a first reference voltage UVLOON (a time T1 shown in FIG. 2), wherein the control circuit 204 receives the supply voltage VCC through a pin 206 and transmits the predetermined signal PS to the power switch 104 through a pin 208, the first reference voltage UVLOON is an under voltage lock out turning-on voltage, the supply voltage VCC corresponds to a direct current (DC) voltage VIN generated by the power converter 100, and an alternating current (AC) voltage VAC inputted to the power converter 100 is rectified into a DC voltage VIN by the power converter 100 through a bridge rectifier 101.

As shown in FIG. 2, the control circuit 204 makes the power converter 100 not start up at a time T2 (wherein a predetermined enabling period of the predetermined signal PS is less than maximum turning-on time of the power switch 104, and the predetermined enabling period can be determined by a designer of the control circuit 204) if a detection voltage VCS is less than a second reference voltage VCSSP during the predetermined enabling period of the predetermined signal PS (wherein the predetermined enabling period of the predetermined signal PS is between the time T1 and the time T2), . . . . In addition, after the control circuit 204 makes the power converter not start up, when the supply voltage VCC is greater than the first reference voltage UVLOON again, the control circuit 204 can generate the control signal CS again to make the gate control signal generation circuit 202 generate the predetermined signal PS to the power switch 104 again to determine whether to continuously make the power converter 100 not start up.

Figure 3:
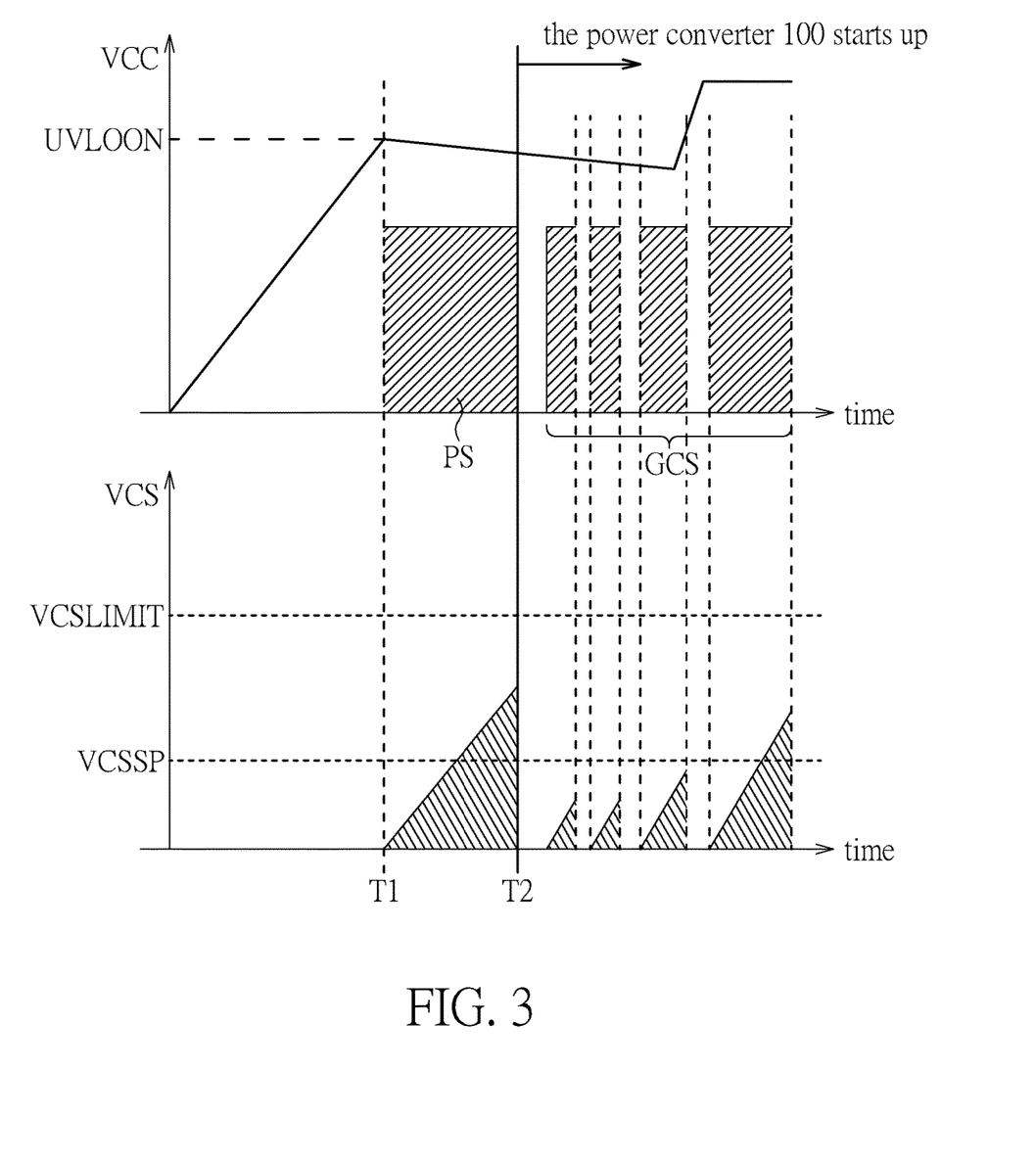

In addition, please refer to FIGS. 1, 3. Before the power converter 100 starts up and when the supply voltage VCC is greater than the first reference voltage UVLOON (the time T1 shown in FIG. 3), the control circuit 204 generates the control signal CS to make the gate control signal generation circuit 202 generate the predetermined signal PS to the power switch 104. If the detection voltage VCS is greater than the second reference voltage VCSSP and less than a fourth reference voltage VCSLIMIT when the predetermined enabling period of the predetermined signal PS (the predetermined enabling period of the predetermined signal PS is between the time T1 and the time T2) is finished (that is, the time T2 shown in FIG. 3), the control circuit 204 makes the gate control signal generation circuit 202 generate a gate control signal GCS to the power switch 104 to make the power converter 100 operate normally, wherein the control circuit 204 transmits the gate control signal GCS to the power switch 104 through the pin 208 after the predetermined enabling period of the predetermined signal (that is, after the time T2).

Figure 4:
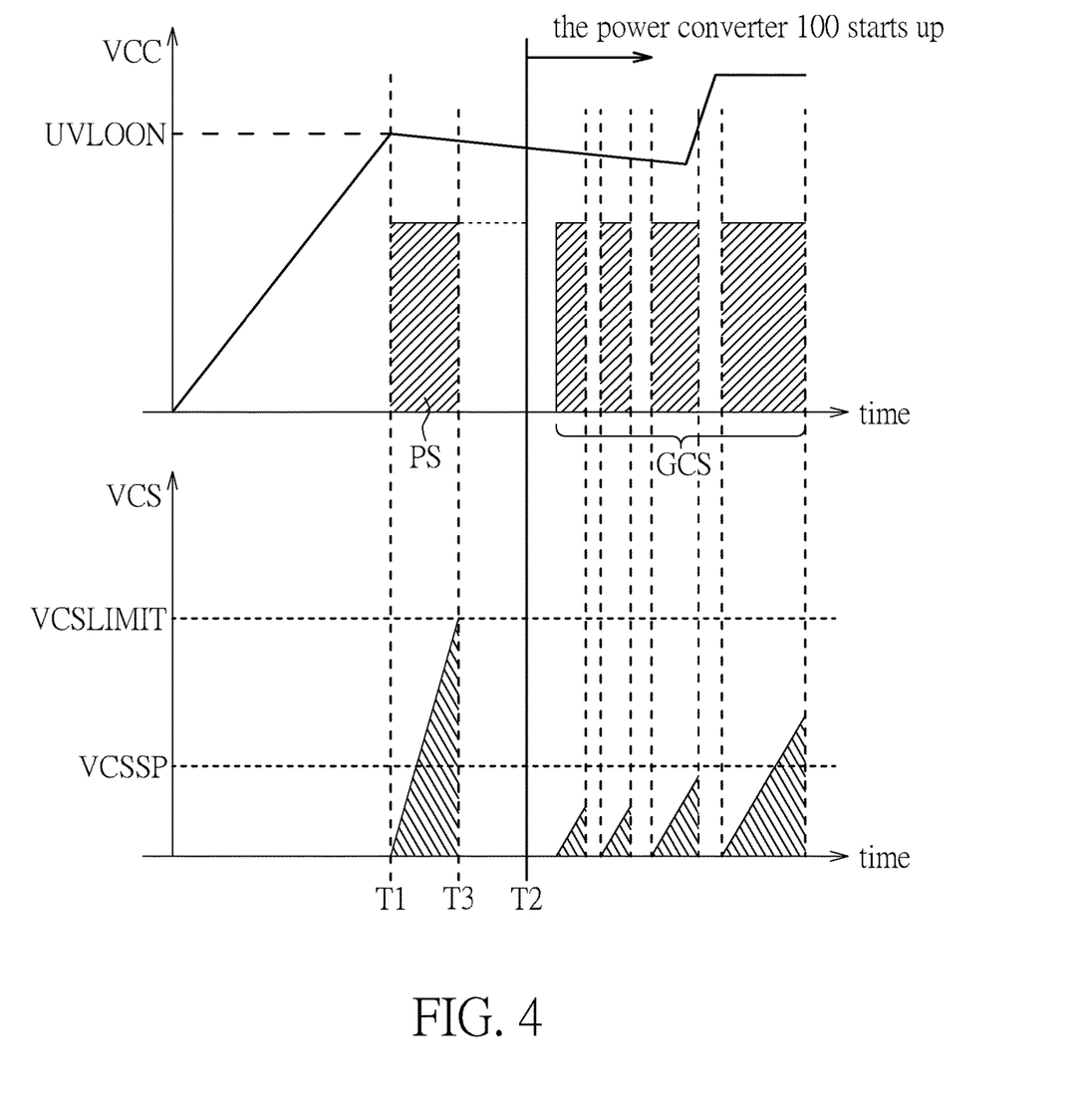

In addition, please refer to FIGS. 1, 4. Before the power converter 100 starts up and when the supply voltage VCC is greater than the first reference voltage UVLOON (the time T1 shown in FIG. 4), the control circuit 204 generates the control signal CS to make the gate control signal generation circuit 202 generate the predetermined signal PS to the power switch 104. If the detection voltage VCS is greater than the fourth reference voltage VCSLIMIT (as shown in FIG. 4, the detection voltage VCS is greater than the fourth reference voltage VCSLIMIT at a time T3) during the predetermined enabling period of the predetermined signal PS (wherein the predetermined enabling period of the predetermined signal PS is between the time T1 and the time T2), the control circuit 204 disables the predetermined signal PS and makes the gate control signal generation circuit 202 generate the gate control signal GCS to the power switch 104 to make the power converter 100 operate normally after the predetermined enabling period of the predetermined signal PS (that is, after the time T2).

Figure 5:
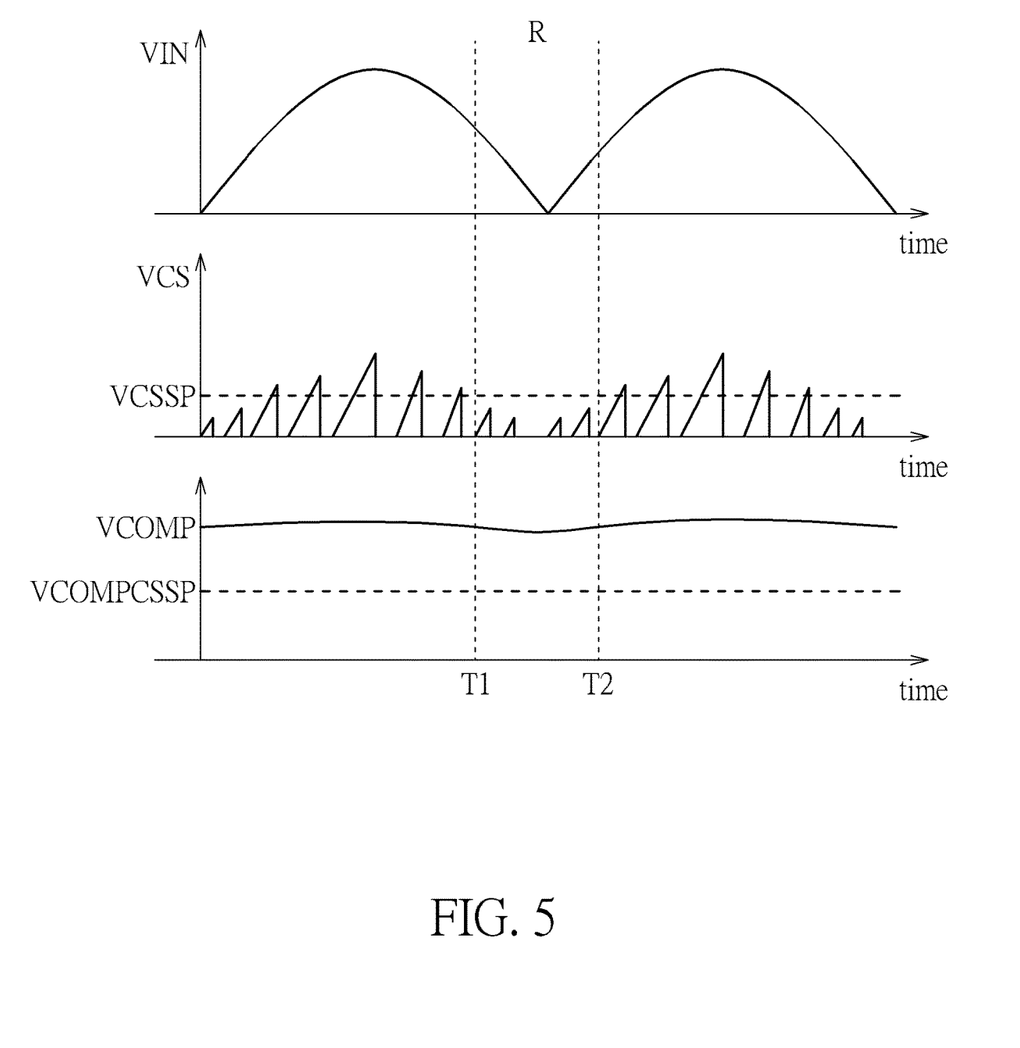
FIGS. 5-7 are diagrams illustrating operational principles of the short-circuited protection after the power converter starts up.

After the power converter 100 starts up, the voltage mode controller 200 utilizes an auxiliary voltage of an auxiliary winding (not shown in FIG. 1) and the detection voltage VCS to determine whether to make the gate control signal generation circuit 202 generate the gate control signal GCS to the power switch 104, wherein an operational principle of determining whether to make the gate control signal generation circuit 202 generate the gate control signal GCS to the power switch 104 is obvious to one of ordinary skill in the art, so further description thereof is omitted for simplicity. As shown in FIG. 5, after the power converter 100 starts up, because the DC voltage VIN is smaller at an area R (wherein the area R is between the time T1 and the time T2) near a valley between two consecutive periods of the DC voltage VIN, the detection voltage VCS corresponding to the area R is also smaller (less than the second reference voltage VCSSP). If meanwhile, the load 102 is larger, a corresponding compensation voltage VCOMP will also be larger (greater than a third reference voltage VCOMPCSSP), wherein in one embodiment of the present invention, the third reference voltage VCOMPCSSP corresponds to a half of the maximum value of the load 102, and the control circuit 204 receives the compensation voltage VCOMP through a pin 212. However, the present invention is not limited to the third reference voltage VCOMPCSSP corresponding to the half of the maximum value of the load 102. That is, the third reference voltage VCOMPCSSP can correspond to N times the load 102, wherein N is between 0 and 1.

As shown in FIG. 5, although the detection voltage VCS corresponding to the area R is less than the second reference voltage VCSSP and the compensation voltage VCOMP is greater than the third reference voltage VCOMPCSSP, because a time interval between the time T1 and the time T2 is less than a de-bounce time, the control circuit 204 will not turn off the power converter 100, wherein the de-bounce time is equal to K times a period of the DC voltage VIN, and K is a real number greater than 1. Because the de-bounce time is equal to K times the period of the DC voltage VIN, the time interval between the time T1 and the time T2 is obviously less than the de-bounce time, resulting in the control circuit 204 not turning off the power converter 100. That is, as shown in FIG. 5, although the detection voltage VCS is changed with variation of the DC voltage VIN so that the detection voltage VCS corresponding to the area R is less than the second reference voltage VCSSP. Because the time interval between the time T1 and the time T2 is less than the de-bounce time, the control circuit 204 will not turn off the power converter 100.

That is, as shown in FIG. 5, although the detection voltage VCS is changed with variation of the DC voltage VIN so that the detection voltage VCS corresponding to the area R is less than the second reference voltage VCSSP. Because the time interval between the time T1 and the time T2 is less than the de-bounce time, the control circuit 204 will not enable the short-circuited protection to turn off the power converter 100.

Figure 6:
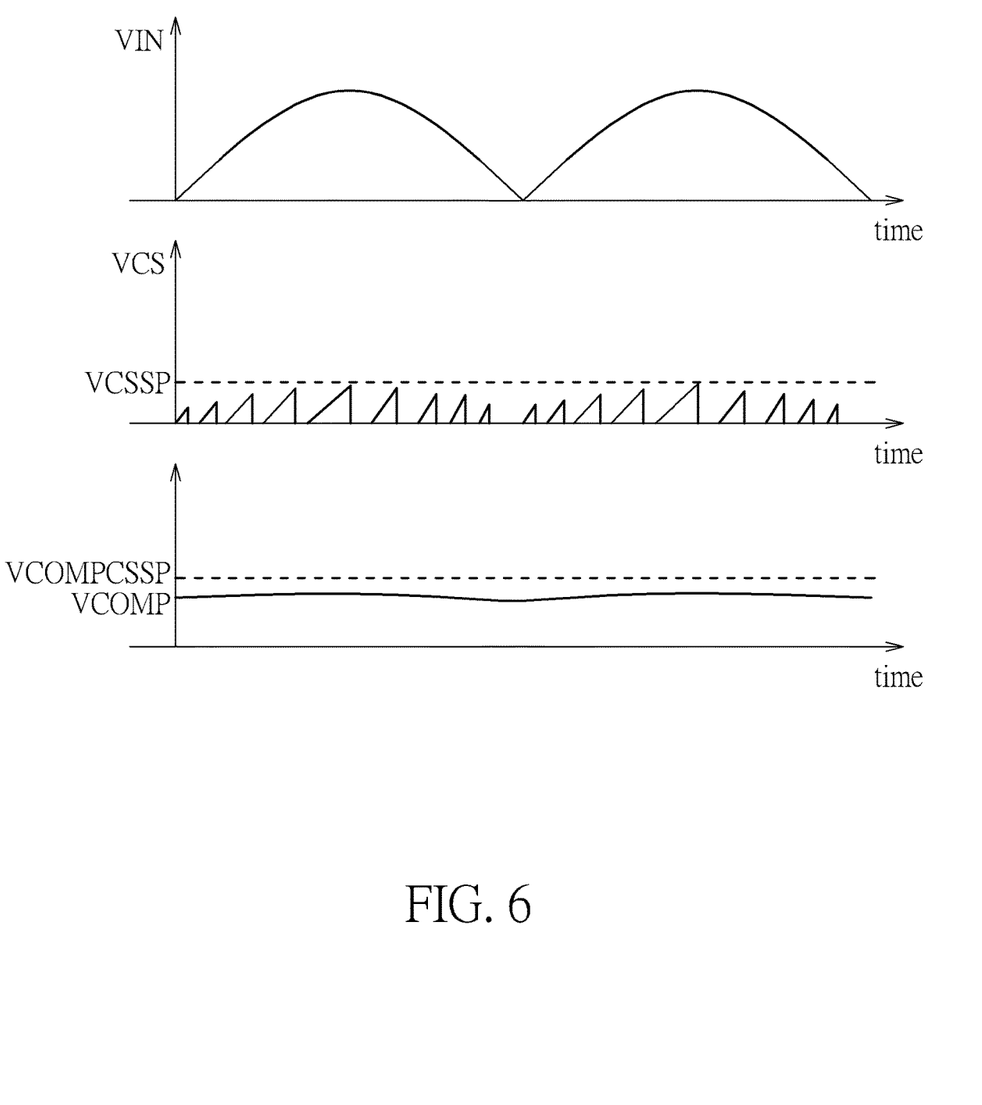

In addition, as shown in FIG. 6, after the power converter 100 starts up, when the load 102 is light, although the detection voltage VCS is still changed with the variation of the DC voltage VIN, the detection voltage VCS will be less than the second reference voltage VCSSP because the load 102 is light.

Meanwhile, the compensation voltage VCOMP is also less than the third reference voltage VCOMPCSSP because the load 102 is light, so the control circuit 204 will still not turn off the power converter 100.

Figure 7:
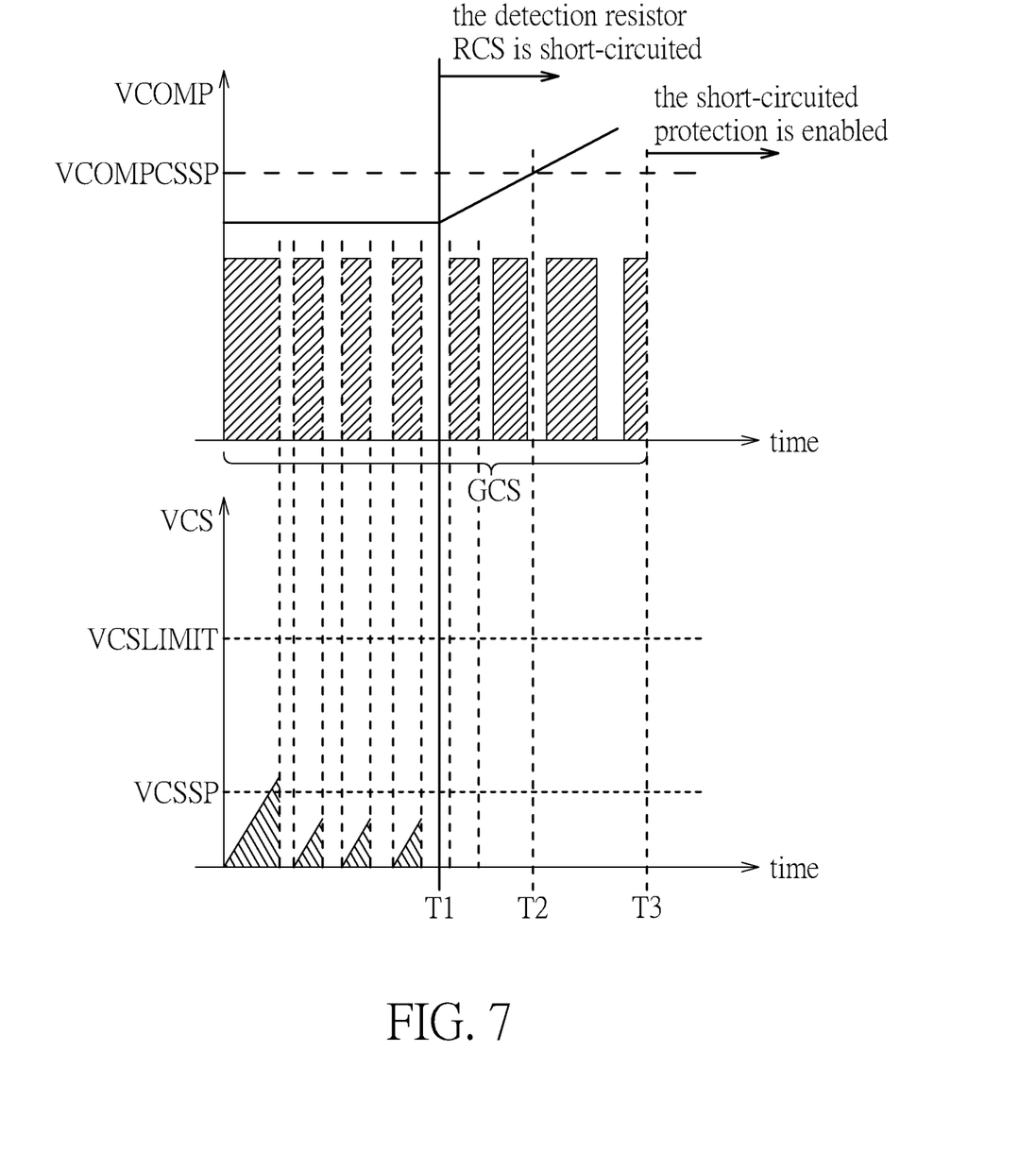

In addition, as shown in FIG. 7, after the power converter 100 starts up and before the time T1, the control circuit 204 can make the gate control signal generation circuit 202 generate the gate control signal GCS to the power switch 104 to make the power converter 100 operate normally. Meanwhile, the load 102 is light, so the compensation voltage VCOMP is less than the third voltage VCOMPCSSP. However, the detection resistor RCS is short-circuited at the time T1, so the control circuit 204 will no longer receive the detection voltage VCS, resulting in the compensation voltage VCOMP starting to be increased until the compensation voltage VCOMP is greater than the third voltage VCOMPVSSP (at the time T2 shown in FIG. 7).

Therefore, after the compensation voltage VCOMP is greater than the third reference voltage VCOMPCSSP, if the detection voltage VCS is less than the second reference voltage VCSSP during the de-bounce time (i.e., the time interval between the time T2 and the time T3), the control circuit 204 makes the gate control signal generation circuit 202 stop generating the gate control signal GCS to the power switch 104 to turn off the power converter 100.

Figure 8:
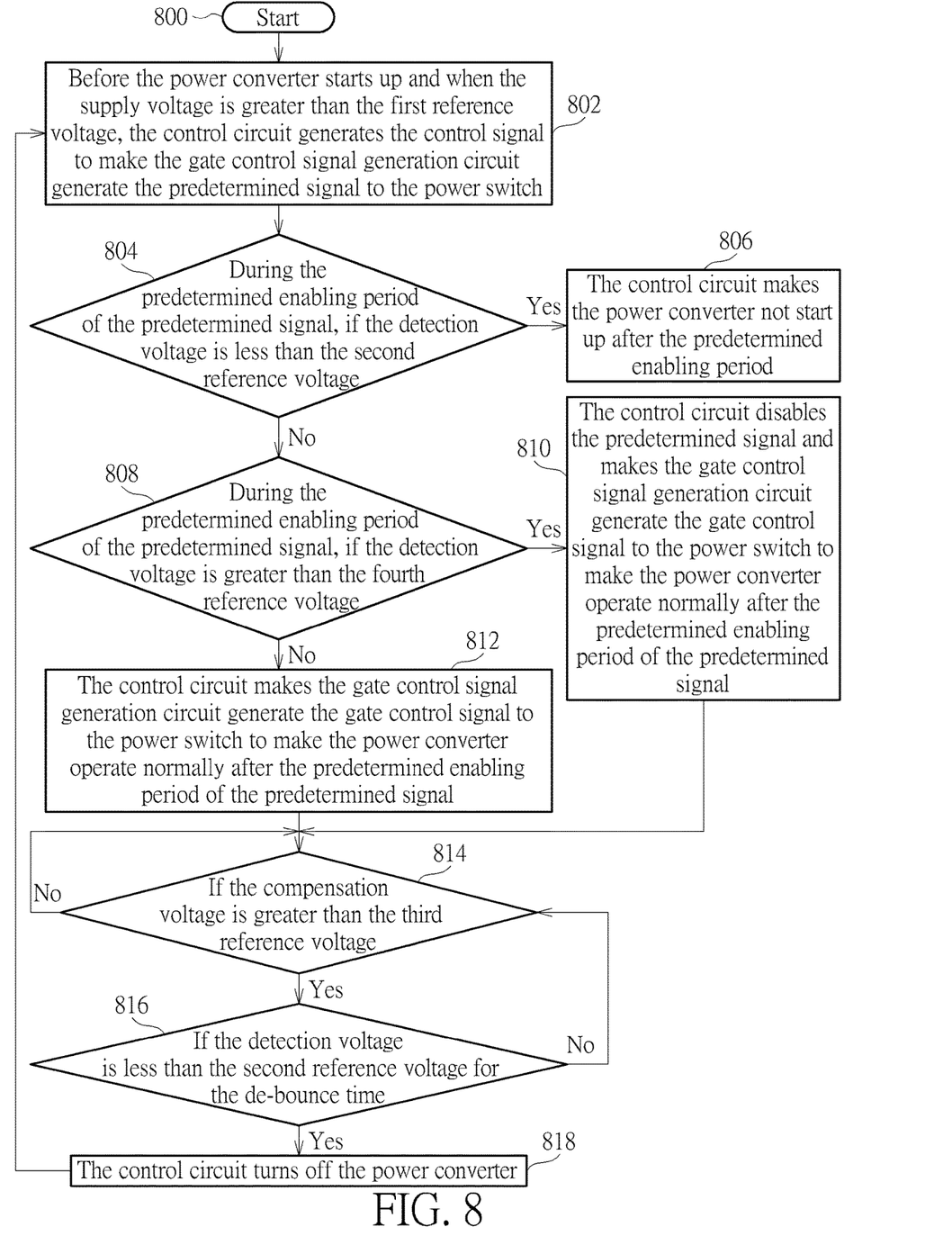
FIG. 8 is a diagram illustrating a flowchart of an operational method of a voltage mode controller applied to short-circuited protection of a power converter according to a second embodiment of the present invention.

Please refer to FIGS. 1-8. FIG. 8 is a flowchart illustrating an operational method of a voltage mode controller applied to a short-circuited protection of a power converter according to a second embodiment of the present invention. The operational method in FIG. 8 is illustrated using the power converter 100 and the voltage mode controller 200 in FIG. 1, the supply voltage VCC, the first reference voltage UVLOON, the detection voltage VCS, the second reference voltage VCSSP, the fourth reference voltage VCSLIMIT, the predetermined signal PS, and the gate control signal GCS in FIGS. 2-4, the DC voltage VIN, the detection voltage VCS, the second reference voltage VCSSP, the compensation voltage VCOMP, and the third reference voltage VCOMPCSSP in FIGS. 5-6, and the detection voltage VCS, the second reference voltage VCSSP, the fourth reference voltage VCSLIMIT, the compensation voltage VCOMP, and the third reference voltage VCOMPCSSP in FIG. 7. Detailed steps are as follows:

Step 800: Start.

Step 802: Before the power converter 100 starts up and when the supply voltage VCC is greater than the first reference voltage UVLOON, the control circuit 204 generates the control signal CS to make the gate control signal generation circuit 202 generate the predetermined signal PS to the power switch 104.

Step 804: During the predetermined enabling period of the predetermined signal PS, if the detection voltage VCS is less than the second reference voltage VCSSP; if yes, go to Step 806; if no, go to Step 808.

Step 806: The control circuit 204 makes the power converter 100 not start up after the predetermined enabling period, go to Step 802.

Step 808: During the predetermined enabling period of the predetermined signal PS, if the detection voltage VCS is greater than the fourth reference voltage VCSLIMIT; if yes, go to Step 810; if no, go to Step 812.

Step 810: The control circuit 204 disables the predetermined signal PS and makes the gate control signal generation circuit 202 generate the gate control signal GCS to the power switch 104 to make the power converter 100 operate normally after the predetermined enabling period of the predetermined signal PS, go to Step 814.

Step 812: The control circuit 204 makes the gate control signal generation circuit generate the gate control signal GCS to the power switch 104 to make the power converter 100 operate normally after the predetermined enabling period of the predetermined signal PS, go to Step 814.

Step 814: If the compensation voltage VCOMP is greater than the third reference voltage VCOMPCSSP; if yes, go to Step 816; if no, go to Step 814.

Step 816: If the detection voltage VCS is less than the second reference voltage VCSSP for the de-bounce time; if yes, go to Step 818; if no, go back to Step 814.

Step 818: The control circuit 204 turns off the power converter 100, go to Step 802.

In Step 802, as shown in FIGS. 1, 2, before the power converter 100 starts up and when the supply voltage VCC is greater than the first reference voltage UVLOON (the time T1 shown in FIG. 2), the control circuit 204 generates a control signal CS to make the gate control signal generation circuit 202 generate the predetermined signal PS to the power switch 104. In Step 806, as shown in FIG. 2, if the detection voltage VCS is less than the second reference voltage VCSSP during the predetermined enabling period of the predetermined signal PS (wherein the predetermined enabling period of the predetermined signal PS is between the time T1 and the time T2), the control circuit 204 makes the power converter 100 not start up at the time T2 (wherein the predetermined enabling period is less than the maximum turning-on time of the power switch 104, and the predetermined enabling period can be determined by the designer of the control circuit 204). That is, as shown in FIG. 2, because the detection voltage VCS is determined by the detection resistor RCS and the primary current IPRI flowing through the primary side PRI of the power converter 100, when the detection resistor RCS is short-circuited, the control circuit 204 will not receive the detection voltage VCS, resulting in the detection voltage VCS (equal to 0) is always less than the second reference voltage VCSSP during the predetermined enabling period of the predetermined signal PS. In addition, after the control circuit 204 makes the power converter not start up, when the supply voltage VCC is greater than the first reference voltage UVLOON again, the control circuit 204 can generate the control signal CS again to make the gate control signal generation circuit 202 generate the predetermined signal PS to the power switch 104 again to determine whether to continuously make the power converter 100 not start up.

In Step 812, please refer to FIGS. 1, 3. Before the power converter 100 starts up and when the supply voltage VCC is greater than the first reference voltage UVLOON (the time T1 shown in FIG. 3), the control circuit 204 generates the control signal CS to make the gate control signal generation circuit 202 generate the predetermined signal PS to the power switch 104. If the detection voltage VCS is greater than the second reference voltage VCSSP and less than the fourth reference voltage VCSLIMIT when the predetermined enabling period of the predetermined signal PS (the predetermined enabling period of the predetermined signal PS is between the time T1 and the time T2) is finished (that is, the time T2 shown in FIG. 3), the control circuit 204 makes the gate control signal generation circuit 202 generate the gate control signal GCS to the power switch 104 to make the power converter 100 operate normally.

In Step 810, please refer to FIGS. 1, 4. Before the power converter 100 starts up and when the supply voltage VCC is greater than the first reference voltage UVLOON (the time T1 shown in FIG. 4), the control circuit 204 generates the control signal CS to make the gate control signal generation circuit 202 generate the predetermined signal PS to the power switch 104. If the detection voltage VCS is greater than the fourth reference voltage VCSLIMIT (as shown in FIG. 4, the detection voltage VCS is greater than the fourth reference voltage VCSLIMIT at the time T3) during the predetermined enabling period of the predetermined signal PS (wherein the predetermined enabling period of the predetermined signal PS is between the time T1 and the time T2), the control circuit 204 disables the predetermined signal PS and makes the gate control signal generation circuit 202 generate the gate control signal GCS to the power switch 104 to make the power converter 100 operate normally after the predetermined enabling period of the predetermined signal PS (that is, after the time T2).

In Step 816, as shown in FIG. 5, after the power converter 100 starts up, because the DC voltage VIN is smaller at the area R (wherein the area R is between the time T1 and the time T2) near the valley between two consecutive periods of the DC voltage VIN, the detection voltage VCS corresponding to the area R is also smaller (less than the second reference voltage VCSSP). If meanwhile, the load 102 is larger, the corresponding compensation voltage VCOMP will also be larger (greater than the third reference voltage VCOMPCSSP).

As shown in FIG. 5, although the detection voltage VCS corresponding to the area R is less than the second reference voltage VCSSP and the compensation voltage VCOMP is greater than the third reference voltage VCOMPCSSP, because the time interval between the time T1 and the time T2 is less than the de-bounce time, the control circuit 204 will not turn off the power converter 100, wherein the de-bounce time is equal to K times the period of the DC voltage VIN, and K is a real number greater than 1. Because the de-bounce time is equal to K times the period of the DC voltage VIN, the time interval between the time T1 and the time T2 is obviously less than the de-bounce time, resulting in the control circuit 204 not turning off the power converter 100. That is, as shown in FIG. 5, although the detection voltage VCS is changed with variation of the DC voltage VIN so that the detection voltage VCS corresponding to the area R is less than the second reference voltage VCSSP. Because the time interval between the time T1 and the time T2 is less than the de-bounce time, the control circuit 204 will not turn off the power converter 100.

In addition, as shown in FIG. 6, after the power converter 100 starts up, when the load 102 is light, although the detection voltage VCS is still changed with the variation of the DC voltage VIN, the detection voltage VCS will be less than the second reference voltage VCSSP because the load 102 is light.

Meanwhile, the compensation voltage VCOMP is also less than the third reference voltage VCOMPCSSP because the load 102 is light, so the control circuit 204 will still not turn off the power converter 100.

In Step 818, as shown in FIG. 7, after the power converter 100 starts up and before the time T1, the control circuit 204 can make the gate control signal generation circuit 202 generate the gate control signal GCS to the power switch 104 to make the power converter 100 operate normally. Meanwhile, the load 102 is light, so the compensation voltage VCOMP is less than the third voltage VCOMPCSSP. However, the detection resistor RCS is short-circuited at the time T1, so the control circuit 204 will no longer receive the detection voltage VCS, resulting in the compensation voltage VCOMP starting to be increased until the compensation voltage VCOMP is greater than the third voltage VCOMPVSSP (at the time T2 shown in FIG. 7).

Therefore, after the compensation voltage VCOMP is greater than the third reference voltage VCOMPCSSP, if the detection voltage VCS is less than the second reference voltage VCSSP during the de-bounce time (i.e., the time interval between the time T2 and the time T3), the control circuit 204 makes the gate control signal generation circuit 202 stop generating the gate control signal GCS to the power switch 104 to turn off the power converter 100.

To sum up, the voltage mode controller provided by the present invention makes the gate control signal generation circuit generate the predetermined signal to the power switch of the primary side of the power converter before the power converter starts up, and determines whether to enable the short-circuited protection according to the detection voltage corresponding to the predetermined signal. In addition, the voltage mode controller provided by the present invention makes the gate control signal generation circuit generate the predetermined signal to the power switch of the primary side of the power converter before the power converter starts up, and determines whether to make the power converter not start up according to the detection voltage corresponding to the predetermined signal. In addition, the voltage mode controller determines whether to turn off the power converter according to the compensation voltage, the detection voltage, and the de-bounce time after the power converter starts up. Therefore, compared to the prior art, because the present invention determines whether to turn off the power converter according to the compensation voltage, the detection voltage, and the de-bounce time after the power converter starts up, the present invention not only can solve a problem of the short-circuited protection being falsely triggered in the prior art but can also pass conditions of a limited power source (LPS) test. In addition, compared to the prior art, the present invention can also determine whether to make the power converter not start up according to the detection voltage corresponding to the predetermined signal before the power converter starts up.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage mode controller applied to a short-circuited protection of a power converter, wherein the voltage mode controller is installed in a primary side of the power converter, the voltage mode controller comprising:
a gate control signal generation circuit; and
a control circuit coupled to the gate control signal generation circuit for generating a control signal to make the gate control signal generation circuit generate a predetermined signal to a power switch of the primary side of the power converter before the power converter starts up and when a supply voltage is greater than a first reference voltage;
wherein if a detection voltage is less than a second reference voltage during a predetermined enabling period of the predetermined signal, the control circuit makes the power converter not start up, and after the power converter starts up, the control circuit turns off the power converter if the detection voltage is less than the second reference voltage for a de-bounce time and a compensation voltage is greater than a third reference voltage;
wherein if the detection voltage is greater than the second reference voltage and less than a fourth reference voltage when the predetermined enabling period of the predetermined signal is finished, the control circuit makes the gate control signal generation circuit generate a gate control signal to the power switch of the primary side of the power converter to make the power converter operate normally after the predetermined enabling period of the predetermined signal.

2. The voltage mode controller of claim 1, wherein the power converter is a flyback power converter.

3. The voltage mode controller of claim 1, wherein the first reference voltage is an under voltage lock out turning-on voltage.

4. The voltage mode controller of claim 1, wherein the supply voltage corresponds to a direct current (DC) voltage generated by the power converter.

5. The voltage mode controller of claim 1, wherein the detection voltage is determined by a detection resistor and a primary current flowing through the primary side of the power converter.

6. The voltage mode controller of claim 1, wherein after the power converter starts up, and if the detection voltage is less than the second reference voltage for the de-bounce time and the compensation voltage is greater than the third reference voltage, the control circuit makes the gate control signal generation circuit stop generating the gate control signal to the power switch of the primary side of the power converter to turn off the power converter.

7. A voltage mode controller applied to a short-circuited protection of a power converter, wherein the voltage mode controller is installed in a primary side of the power converter, the voltage mode controller comprising:
a gate control signal generation circuit; and
a control circuit coupled to the gate control signal generation circuit for generating a control signal to make the gate control signal generation circuit generate a predetermined signal to a power switch of the primary side of the power converter before the power converter starts up and when a supply voltage is greater than a first reference voltage;
wherein if a detection voltage is less than a second reference voltage during a predetermined enabling period of the predetermined signal, the control circuit makes the power converter not start up, and after the power converter starts up, the control circuit turns off the power converter if the detection voltage is less than the second reference voltage for a de-bounce time and a compensation voltage is greater than a third reference voltage;
wherein if the detection voltage is greater than a fourth reference voltage during the predetermined enabling period of the predetermined signal, the control circuit disables the predetermined signal and makes the gate control signal generation circuit generate a gate control signal to the power switch of the primary side of the power converter to make the power converter operate normally after the predetermined enabling period of the predetermined signal.

8. The voltage mode controller of claim 7, wherein the power converter is a flyback power converter.

9. The voltage mode controller of claim 7, wherein the first reference voltage is an under voltage lock out turning-on voltage.

10. The voltage mode controller of claim 7, wherein the supply voltage corresponds to a direct current voltage generated by the power converter.

11. The voltage mode controller of claim 7, wherein the detection voltage is determined by a detection resistor and a primary current flowing through the primary side of the power converter.

12. The voltage mode controller of claim 7, wherein after the power converter starts up, and if the detection voltage is less than the second reference voltage for the de-bounce time and the compensation voltage is greater than the third reference voltage, the control circuit makes the gate control signal generation circuit stop generating the gate control signal to the power switch of the primary side of the power converter to turn off the power converter.

13. An operational method of a voltage mode controller applied to a short-circuited protection of a power converter, wherein the voltage mode controller comprises a gate control signal generation circuit and a control circuit, and the voltage mode controller is installed in a primary side of the power converter, the operational method comprising:
before the power converter starts up and when a supply voltage is greater than a first reference voltage, the control circuit generating a control signal to make the gate control signal generation circuit generate a predetermined signal to a power switch of the primary side of the power converter;
if a detection voltage is less than a second reference voltage during a predetermined enabling period of the predetermined signal, the control circuit making the power converter not start up after the predetermined enabling period;

after the power converter starts up, if a compensation voltage is greater than a third reference voltage and the detection voltage is less than the second reference voltage for a de-bounce time, the control circuit turning off the power converter; and if the detection voltage is greater than the second reference voltage and less than a fourth reference voltage when the predetermined enabling period of the predetermined signal is finished, the control circuit making the gate control signal generation circuit generate a gate control signal to the power switch of the primary side of the power converter to make the power converter operate normally after the predetermined enabling period of the predetermined signal.

14. The operational method of claim 13, wherein the first reference voltage is an under voltage lock out turning-on voltage.

15. The operational method of claim 13, wherein the supply voltage corresponds to a DC voltage generated by the power converter.

16. The operational method of claim 13, wherein the detection voltage is determined by a detection resistor and a primary current flowing through the primary side of the power converter.

17. The operational method of claim 13, wherein after the power converter starts up and if the detection voltage is less than the second reference voltage for the de-bounce time and the compensation voltage is greater than the third reference voltage, the control circuit makes the gate control signal generation circuit stop generating the gate control signal to the power switch of the primary side of the power converter to turn off the power converter.

18. An operational method of a voltage mode controller applied to a short-circuited protection of a power converter, wherein the voltage mode controller comprises a gate control signal generation circuit and a control circuit, and the voltage mode controller is installed in a primary side of the power converter, the operational method comprising:

before the power converter starts up and when a supply voltage is greater than a first reference voltage, the control circuit generating a control signal to make the gate control signal generation circuit generate a predetermined signal to a power switch of the primary side of the power converter;

if a detection voltage is less than a second reference voltage during a predetermined enabling period of the predetermined signal, the control circuit making the power converter not start up after the predetermined enabling period;

after the power converter starts up, if a compensation voltage is greater than a third reference voltage and the detection voltage is less than the second reference voltage for a de-bounce time, the control circuit turning off the power converter; and if the detection voltage is greater than a fourth reference voltage during the predetermined enabling period of the predetermined signal, the control circuit disabling the predetermined signal and making the gate control signal generation circuit generate a gate control signal to the power switch of the primary side of the power converter to make the power converter operate normally after the predetermined enabling period of the predetermined signal.

19. The operational method of claim 18, wherein the first reference voltage is an under voltage lock out turning-on voltage.

20. The operational method of claim 18, wherein the supply voltage corresponds to a DC voltage generated by the power converter.

21. The operational method of claim 18, wherein the detection voltage is determined by a detection resistor and a primary current flowing through the primary side of the power converter.

22. The operational method of claim 18, wherein after the power converter starts up and if the detection voltage is less than the second reference voltage for the de-bounce time and the compensation voltage is greater than the third reference voltage, the control circuit makes the gate control signal generation circuit stop generating the gate control signal to the power switch of the primary side of the power converter to turn off the power converter.

* * * * *